United States Patent [19]
Asai et al.

[11] Patent Number: 5,610,426
[45] Date of Patent: Mar. 11, 1997

[54] SEMICONDUCTOR INTEGRATED CIRCUIT DEVICE HAVING EXCELLENT DUAL POLARITY OVERVOLTAGE PROTECTION CHARACTERISTICS

[75] Inventors: Akiyoshi Asai, Aichi-gun; Kazuhiro Tsuruta, Toyoake; Takeshi Enya, Nagoya, all of Japan

[73] Assignee: Nippondenso Co., Ltd., Kariya, Japan

[21] Appl. No.: 505,819

[22] Filed: Jul. 21, 1995

[30]   Foreign Application Priority Data

Jul. 21, 1994  [JP]  Japan .................................. 6-169738

[51] Int. Cl.⁶ .................................................. H01L 23/62
[52] U.S. Cl. .......................................... 257/360; 257/355
[58] Field of Search ................................ 257/355, 356, 257/357, 359, 360, 210

[56]            References Cited

U.S. PATENT DOCUMENTS

| 4,893,159 | 1/1990 | Suzuki et al. | 257/360 |
|---|---|---|---|
| 5,389,811 | 2/1995 | Poucher et al. | 257/360 |
| 5,438,213 | 8/1995 | Tailliet | 257/360 |
| 5,449,940 | 9/1995 | Hirata | 257/360 |
| 5,500,542 | 3/1996 | Iida et al. | 257/210 |

FOREIGN PATENT DOCUMENTS

| 297066 | 4/1990 | Japan . |
|---|---|---|
| 2260459 | 10/1990 | Japan . |
| 319359 | 1/1991 | Japan . |
| 4226065 | 8/1992 | Japan . |
| 4345064 | 12/1992 | Japan . |
| 653497 | 2/1994 | Japan . |

*Primary Examiner*—Sara W. Crane
*Assistant Examiner*—Adriana Giordana
*Attorney, Agent, or Firm*—Cushman, Darby & Cushman Ip Group of Pillsbury Maidson & Sutro LLP

[57]              ABSTRACT

A protective circuit that can maintain effectiveness when excess voltages of both polarities are applied is placed between the input terminal of an internal CMOS inverter and an input pad. The protective circuit includes a protective resistor, a P-channel MOSFET and an N-channel MOSFET. The N-channel MOSFET is placed between a connecting line and a ground terminal with the gate terminal of the MOSFET connected to the connecting line. The P-channel MOSFET is placed between the connecting line and the ground terminal with the gate terminal of the MOSFET connected to the connecting line. The P-channel MOSFET releases excess negative voltage from the outside using ON-state current and the N-channel MOSFET releases excess positive voltage from the outside using ON-state current.

11 Claims, 7 Drawing Sheets

SEMICONDUCTOR INTEGRATED CIRCUIT DEVICE HAVING EXCELLENT DUAL POLARITY OVERVOLTAGE PROTECTION CHARACTERISTICS

CROSS REFERENCE TO RELATED APPLICATION

This application is related to and claims priority from Japanese Patent Application No. Hei. 6-169738, the contents of which are hereby incorporated by reference.

BACKGROUND OF THE INVENTION

1. Field of the Invention

The present invention relates to a semiconductor integrated circuit device having an SOI (silicon on insulator) structure and a protective circuit for protecting the semiconductor from surge voltages and the like.

2. Description of Related Art

For semiconductor integrated circuit devices, technology for providing a protective circuit for a circuit having a thin-film SOIMOS (silicon on insulator, metal oxide semiconductor) construction is known in the art. FIG. 11 shows one example of a semiconductor integrated circuit device having a protective circuit. In this construction, an N-channel MOSFET (protective transistor) 54 is provided between input pad 51 and ground terminal ($V_{ss}$) 52 through protective resistor 53. Here, if a negative surge voltage is applied to input pad 51, N-channel MOSFET 54 switches on, current flows therethrough and thus excess voltage is released and the semiconductor integrated circuit 55 is protected. On the other hand, if a positive surge voltage is applied, then due to the construction or the like of the N-channel MOSFET 54, parasitic bipolar operations, avalanche breakdown of the PN junction, punch-through between the source and the drain or the like occurs and leads to the breakdown of the N-channel MOSFET 54 which releases excess electric voltage through the flow of current.

However, the protective transistor (N-channel MOSFET 54) is not as effective with this method of releasing excess voltage by letting current flow via the breakdown of the N-channel MOSFET 54 compared to the case when excess voltage is released using the ON-state of N-channel MOSFET 54. In other words, the protective transistor is less effective when positive surge voltage is applied to it compared to the case when negative surge voltage is applied.

One device proposed to solve this problem is disclosed in FIG. 8 of Japanese Patent Laid Open Publication Hei. 4-226065. This device releases electrostatic charge (excess voltage) provided from the bond pad which is the external input terminal to the ground side. In other words, if negative electrostatic charge is provided from the bond pad, an ESDP (electrostatic discharge protection) diode releases the electrostatic charge; on the other hand, if positive electrostatic charge is provided from the bond pad, the ESDP transistor releases the electrostatic charge.

However, if the ESDP diode and ESDP transistor disclosed in Japanese Patent Laid Open Publication Hei. 4-226065 are formed on the same substrate, an increase in the area of the protective element may be avoided by using a parasitic diode formed between the drain diffusion layer of the ESDP transistor and the semiconductor substrate as the ESDP diode. However, for the transistor having an SOI structure, the parasitic diode is not formed between the above drain diffusion layer and semiconductor substrate and thus there is a need for form the ESDP diode separately. Thus circuit area becomes large during the formation of the ESDP transistor and ESDP diode using an SOI structure.

SUMMARY OF THE INVENTION

In view of the foregoing problems of the prior art in mind, it is a goal of the present invention to provide a semiconductor integrated circuit device which prevents declines in the effectiveness of the elements that constitute the protective circuit when excess voltages of positive and negative polarities are applied.

It is a further object of the present invention to provide a semiconductor integrated circuit device which has an input protective circuit of simple construction and of not considerably large size.

It is another object of the present invention to provide a semiconductor integrated circuit device that has a protective circuit which has a simple construction and small size.

To achieve these aims, one aspect of the present invention provides a semiconductor integrated circuit device including a semiconductor integrated circuit formed in a semiconductor layer on an insulating layer on top of a semiconductor substrate and a protective circuit provided between the semiconductor integrated circuit and an external connection terminal, where the protective circuit includes a first element having a first current path for releasing excess negative voltage from the external member, and a second element having a second current path for releasing excess positive voltage from the external member.

In this way, the protective circuit has at least a first element having a first current path for releasing excess negative voltage from the external member, and a second element having a second current path for releasing excess positive voltage from the external member. Then, excess negative voltage provided from outside is released using the first element. On the other hand, excess positive voltage provided from the outside is released using the second element.

Thus, the release of excess positive and negative voltage is possible. Accordingly, there is no decline in the effectiveness of the element with respect to applying excess voltage of either polarity and the same effectiveness is maintained for all excess voltage polarities.

A further aspect of the present invention provides a semiconductor integrated circuit device where the protective circuit is formed in a semiconductor layer on an insulating layer which is on the semiconductor substrate.

In another aspect of the present invention, the semiconductor integrated circuit device as described above has a first transistor that releases excess negative voltage from an outside member using ON-state current, and a second transistor that releases excess positive voltage from an outside member using ON-state current.

In this way, excess negative voltage applied-from the outside is released using the ON-state current of the first transistor. Also, excess positive voltage applied from the outside is released using the ON-state current of the second transistor.

Accordingly, excess voltage having either positive or negative polarity is released using the ON-state current of the transistor without the use of current due to the breakdown of the first and second transistors that form the protective circuit. Thus, there is no decline in the effectiveness of the protection circuit if excess voltage of either polarity is applied and virtually the same level of effectiveness is maintained for either polarity of excess voltage.

An object of an additional aspect of the present invention is to provide a semiconductor integrated circuit device as described above having first and second MOSFET transistors, where the magnitude of the threshold voltage of the first MOSFET is smaller than the magnitude of the breakdown voltage of the second MOSFET, and the magnitude of the threshold voltage of the second MOSFET is smaller than the magnitude of the breakdown voltage of the first MOSFET.

In this way, excess voltage from the outside having a negative polarity which exceeds the threshold voltage of the first MOSFET is released using the ON-state current of the first MOSFET before the second MOSFET breaks down. Also, excess voltage from the outside having a positive polarity and which exceeds the threshold voltage of the second MOSFET is released using the ON-state current of the second MOSFET before the first MOSFET breaks down.

Another aspect of the present invention is that the layer thickness of the gate oxide film of the second MOSFET is thicker than the film thickness of the oxide film of the MOSFETS that form the semiconductor integrated circuit device.

Thus, thickening the film thickness of the gate oxide film of the second MOSFET enables the adjustment of the threshold voltage values.

Moreover, a further aspect of the present invention aims to provide a semiconductor integrated circuit device as described above having a diode which releases excess negative voltage from the outside using forward bias, and a transistor releasing excess positive voltage from the outside using ON-state current.

In this way, excess negative voltage provided by an external source is released using the forward bias of the diode. In addition, excess positive voltage provided from the outside is released using the ON-state current of the transistor.

Thus, excess voltage of either positive or negative polarity is released without using current due to the breakdown of the transistor and diode that form the protective circuit. Accordingly, the same level of effectiveness is maintained with both polarities of excess voltage.

In addition, a yet further aspect of the present invention provides a semiconductor integrated circuit device as described above where the transistor is formed using a MOSFET with the magnitude of the threshold voltage of the MOSFET set lower than the magnitude of the breakdown voltage of the diode.

In this way, excess positive voltage from the outside which exceeds the threshold voltage of the MOSFET is released using the ON-state current of the MOSFET before the diode breaks down.

Furthermore, another aspect of the present invention is that the semiconductor integrated circuit device has at least one common layer among the multiple diffusion layers which form the diode and MOSFET. As a result, the occupied area of the device is smaller.

Moreover, a yet further aspect of the present invention aims to provide a semiconductor integrated circuit device as described above where the planar structures of the diode and MOSFET have gate electrodes having multiple openings and which are placed in a lattice-form, the semiconductor layer of the multiple openings is formed of a common first conductive diffusion layer used for the MOSFET and diode and a first conductive diffusion layer used for the MOSFET, the semiconductor layer of the outer side of the gate electrode is formed of a high impurity concentration second conductive diffusion layer used for the diode, and the semiconductor layer below the gate electrode is formed of a common, low impurity concentration second conductive diffusion layer used for the MOSFET and diode.

According to this aspect of the present invention, excess negative voltage from the outside is released from the common first conductive diffusion layer of the openings of gate electrodes arranged in a lattice via a common low impurity concentration second conductive diffusion layer below the gate electrodes, to the high impurity concentration second conductive layer used for the diode and provided at the outer side of the gate electrode (diode operation). In addition, excess positive voltage from the outside is released from the common first conductive diffusion layer of the openings of the gate electrodes arranged in a lattice via an inversion layer formed in the low impurity concentration second conductive diffusion layer below the gate electrodes to the first conductive diffusion layer for the MOSFET of the opening part of the gate electrode arranged in a lattice (MOSFET operation). Accordingly, the path through which excess voltage passes, in other words, the channel widths of the diode and MOSFET, can be effectively enlarged to lessen the density of excess current and thus the effectiveness of the device can be improved.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

The preferred embodiments of the present invention are hereinafter described with reference to the accompanying drawings.

Figure 1:
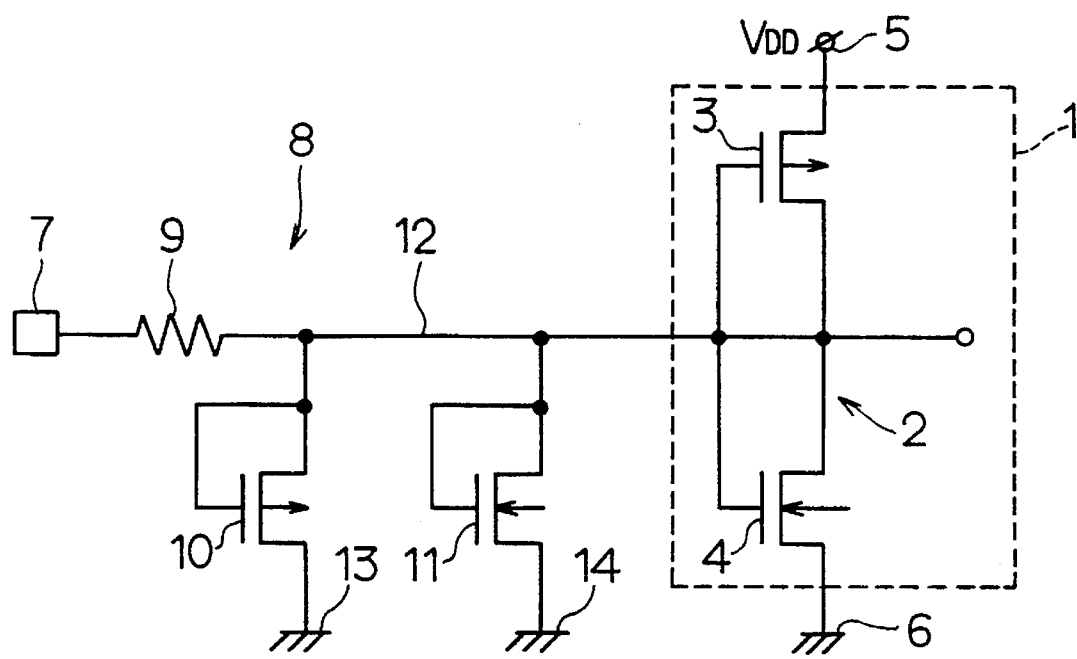
FIG. 1 is a schematic diagram of a semiconductor integrated circuit device according to a first embodiment of the present invention.

FIG. 1 shows the electrical structure of the semiconductor integrated circuit device. In this Figure, an inverter 2 is used in the input stage inside an internal circuit 1 of a semiconductor integrated circuit. This inverter 2 includes of a P-channel MOSFET 3 and an N-channel MOSFET 4. Also, an electric power source terminal 5 is connected to the source electrode of the P-channel MOSFET 3 of inverter 2 while the source electrode of N-channel MOSFET 4 is connected to ground terminal 6. An voltage, e.g., 3 volts, is applied as the source voltage $V_{DD}$ to the electric power source terminal 5. Protective circuit 8 is placed between the input terminal of inverter 2 and the input pad (bonding pad) 7 which acts as the external connection terminal. Protective circuit 8 includes a protective resistor 9, a P-channel MOSFET 10 and an N-channel MOSFET 11. In short, protective resistor 9 is placed along connecting line 12 which connects input pad 7 and the input terminal of inverter 2. Furthermore, P-channel MOSFET 10 is placed between connecting line 12 and ground terminal ($V_{ss}$) 14 while the gate terminal of P-channel MOSFET 10 is connected to connecting line 12. Moreover, N-channel MOSFET 11 is placed between connecting line 12 and ground terminal ($V_{ss}$) 14 with the gate terminal of N-channel MOSFET 11 connected to connecting line 12.

Figure 2:
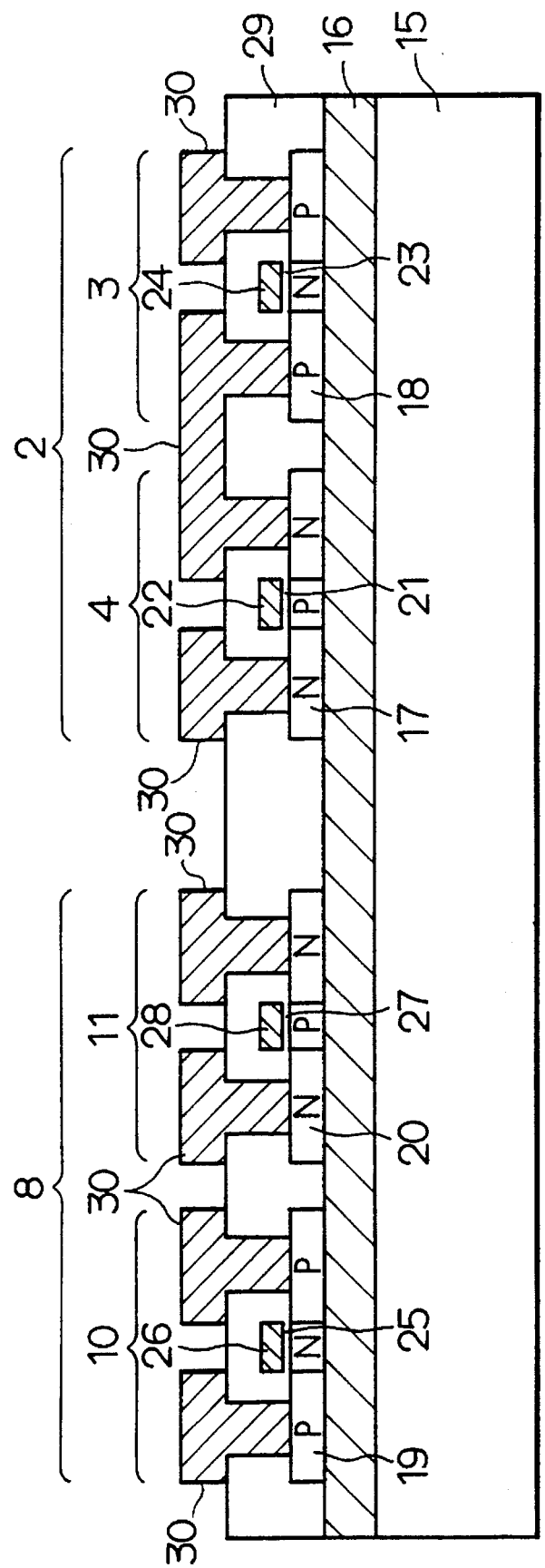
FIG. 2 is a cross-sectional view of the semiconductor integrated circuit device of FIG. 1.

FIG. 2 is a cross-sectional view of the main parts of the input part of the semiconductor integrated circuit device. The protective resistor 9, input path 7 and the like which are shown in FIG. 1 are omitted from this figure for simplicity.

An embedded oxide film 16 which is the insulating layer is formed on top of the single crystal silicon substrate 15 which is the semiconductor substrate. Silicon layers (hereinafter referred to as SOI layers) 17–20 which are the semiconductor layers are placed on top of the embedded oxide film 16. N-channel MOSFET 4 is constructed by forming polysilicon gate terminal 22 on top of SOI layer 17 via gate oxide film 21. On the other hand, P-channel MOSFET 3 is constructed by forming polysilicon gate terminal 24 on top of SOI layer 18 via gate oxide film 23. Inverter 2 is formed from both MOSFETs 3, 4.

Furthermore, P-channel MOSFET 10 is constructed by forming polysilicon gate terminal 26 on top of SOI layer 19 via gate oxide film 25. On the other hand, N-channel MOSFET 11 is constructed by forming polysilicon gate terminal 28 on top of SOI layer via gate oxide film 27. These two MOSFETs 10, 11 become the transistors that constitute the protective circuit 8 described before. P-channel and N-channel MOSFETs 10, 11 which constitute protective circuit 8 described before are formed at the same time using the same production process used for MOSFETs 3, 4 that constitute inverter 2. However, it must be noted that structural parameters such as the gate lengths of MOSFET 10, 11 should satisfy the designated values for electric characteristics of the transistor described later such as for withstanding high voltages or the like. These parameters can be set to values different to those of the MOSFET of internal circuit 1.

In addition, for FIG. 2, the top of embedded oxide film 16 which contains SOI layers 17–20 is covered with intermediate insulating film 29 and is provided with wiring 30 made of aluminum or the like.

The characteristics of P-channel and N-channel MOSFETs 10, 11 which constitute protective circuit 8 are explained below.

Figure 3:
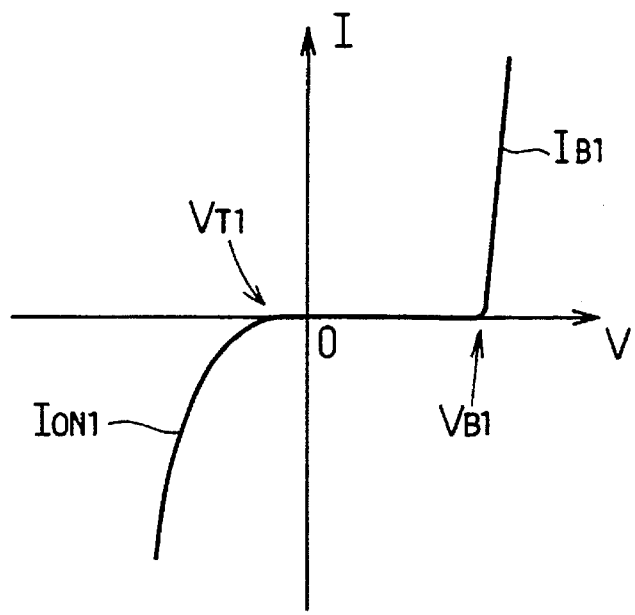
FIG. 3 shows a characteristic curve of voltage versus current for the P-channel MOSFET of FIG. 1.
Figure 4:
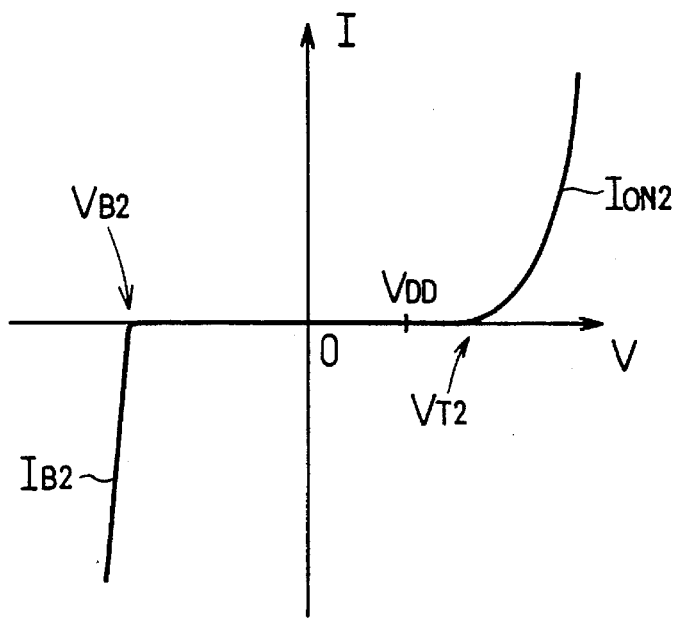
FIG. 4 shows a characteristic curve of voltage versus current for the N-channel MOSFET of FIG. 1.

P-channel MOSFET 10 and N-channel MOSFET 11 both have their gate electrodes shorted to the source or the drain, and thus they can be considered as two-terminal elements which exhibit some electrical characteristics of a commonly-known diode. FIGS. 3 and 4 show the voltage versus current characteristic curves for P-channel MOSFET 10 and N-channel MOSFET 11 when voltage is applied between input pad 7 and ground terminal ($V_{SS}$) 13, 14.

The value of threshold voltage $V_{T1}$ of P-channel MOSFET 10 is negative while the value of threshold voltage $V_{T2}$ of N-channel MOSFET 11 is positive. Furthermore, the magnitude of the threshold voltage $V_{T1}$ of P-channel MOSFET 10 is smaller than the magnitude of the breakdown voltage $V_{B2}$ of the N-channel MOSFET 11 (i.e., $|V_{T1}|<V_{B2}|$). Also, the magnitude of the threshold voltage $V_{T2}$ of N-channel MOSFET 11 is smaller than the magnitude of the breakdown voltage $V_{B1}$ of P-channel MOSFET 10 (i.e., $|V_{T2}|<|V_{B1}|$).

In other words, for P-channel MOSFET 10, if a negative voltage having an magnitude greater than threshold voltage $V_{T1}$ is applied to input pad 7, P-channel MOSFET 10 turns on and ON-state current $I_{ON1}$ flows. Also, if a positive voltage greater than breakdown voltage $V_{B1}$ is applied, P-channel MOSFET 10 breaks down and breakdown current $I_{B1}$ flows therethrough. On the other hand, for the N-channel MOSFET 11, if a positive voltage greater than threshold voltage $V_{T2}$ is applied to input pad 7, N-channel MOSFET 11 turns on and ON-state current $I_{ON2}$ flows therethrough. Furthermore, if a negative voltage having an magnitude greater than breakdown voltage $V_{B2}$ is applied, breakdown current $I_{B2}$ flows through MOSFET 11 due to the breakdown thereof.

Moreover, for N-channel MOSFET 11, as shown in FIG. 4, the magnitude of its threshold voltage $V_{T2}$ is greater than source voltage $V_{DD}$ but lower than the breakdown voltage of the protective internal circuit 1. For example, if the breakdown voltage of gate oxide films 21, 23 of MOSFETs 3, 4 used in the internal circuit 1 is set to 8 volts, then this value is set as the breakdown voltage of internal circuit 1, and setting electric source voltage $V_{DD}$ to 3 volts, then threshold voltage $V_{T2}$ of N-channel MOSFET 11 is set to a value between 3 to 8 volts. Meanwhile, it must be noted here that normally the threshold voltages of MOSFETs 3, 4 used in internal circuit 1 are set lower than source voltage $V_{DD}$ and thus they cannot be used as is as protective transistors, and structural changes or changes in the manufacturing process are needed to change the threshold voltages. Increasing the threshold voltage of N-channel MOSFET 11 can be implemented through various measures such as increasing the concentration of the impurities in the channel region, thickening the gate oxide film 27, thickening the SOI layer or the like.

It must be noted here that normally to realize such advanced functions such as kink phenomenon prevention, gate capacity drop or the like in SOI-MOSFETs 3, 4 which form the internal circuit, the channel regions of MOSFETs 3, 4 when they are in the ON-state are almost completely depleted in the direction of the film thickness; in other words, the MOSFET is constructed according to commonly-known complete depletion conditions. However, it is not always necessary for N-channel MOSFET 11 which forms the protective transistor to satisfy this condition and the various structural parameters can be adjusted to realize the desired threshold voltage $V_{T2}$. To put it concretely, for example, if the channel impurity concentration is $1.8 \times 10^{17}$ cm$^{-3}$, the film thickness of gate oxide film 27 is 80 nm, and the film thickness of SOI layer 20 is 200 nm for a depletion type SOI-nMOSFET which uses an N+polysilicon gate terminal, a threshold voltage of approximately 5 volts can be derived.

The operations of protective circuit 8 are explained below using FIGS. 3 and 4.

For protective circuit 8, MOSFETs 10, 11 are connected in parallel between input pad 7 and connecting elements ($V_{ss}$) 13, 14. The characteristics of each MOSFET 10, 11 are chosen so that $|V_{T1}|<|V_{B2}|$ and $|V_{T2}|<|V_{B1}|$. Accordingly, if positive surge voltage is applied to input pad 7, the excess voltage is released using ON-state current $I_{ON2}$ of N-channel MOSFET 11. Moreover, in case a negative surge voltage is applied, the excess voltage is released using ON-state current $I_{ON1}$ of P-channel MOSFET 10. Thus, inverter 2 (MOSFET 3, 4) of internal circuit 1 is protected through this series of operations. In other words, because excess voltage of either negative and positive polarity is released using the ON-state currents of MOSFETs 10, 11, there are no declines in the effectiveness of MOSFETs 10, 11 when either polarity of surge voltage is applied and thus the same effectiveness is maintained for either polarity of surge voltage.

Also, during regular operation, in other words, when the voltage applied to input pad 7 is between 0 volts and threshold voltage $V_{T2}$ of N-channel MOSFET 11, both MOSFETs 10, 11 are off and the voltage signal provided to input pad 7 reaches internal circuit 1.

For the foregoing embodiment, protective circuit 8 consists of at least P-channel MOSFET 10 which releases excess negative voltage provided from the outside using ON-state current $I_{ON1}$, and N-channel MOSFET 11 which releases excess positive voltage provided from the outside using ON-state current $I_{ON2}$.

In this way, for surge voltage of either negative or positive polarity, excess current is released using the ON-state current of the transistor without relying on the breakdown current of P-channel and N-channel MOSFETs 10, 11 which constitute protective circuit 8. Accordingly, there is no decline in the effectiveness of the transistor for excess voltage of either polarity and thus, the same effectiveness is maintained for excess voltage of either polarity.

In other words, ON-state current $I_{ON1}$ is used for releasing excess negative voltage provided from the outside that exceeds threshold voltage $V_{T1}$ of P-channel MOSFET 10, and ON-state current $I_{ON2}$ is used for releasing excess positive voltage provided from the outside that exceeds threshold voltage $V_{T2}$ of N-channel MOSFET 11. Furthermore, as shown in FIGS. 3, 4, by setting the characteristics of each MOSFET 10, 11 so that $|V_{T1}|<|V_{B2}|$ and $|V_{T2}|<|V_{B1}|$, excess voltage is released using ON-state current $I_{ON1}$ of P-channel MOSFET 10 before N-channel MOSFET 11 breaks down. Also, excess positive voltage applied from the outside is released using ON-state current $I_{ON2}$ of N-channel MOSFET 11 before P-channel MOSFET 10 breaks down.

Figure 5:
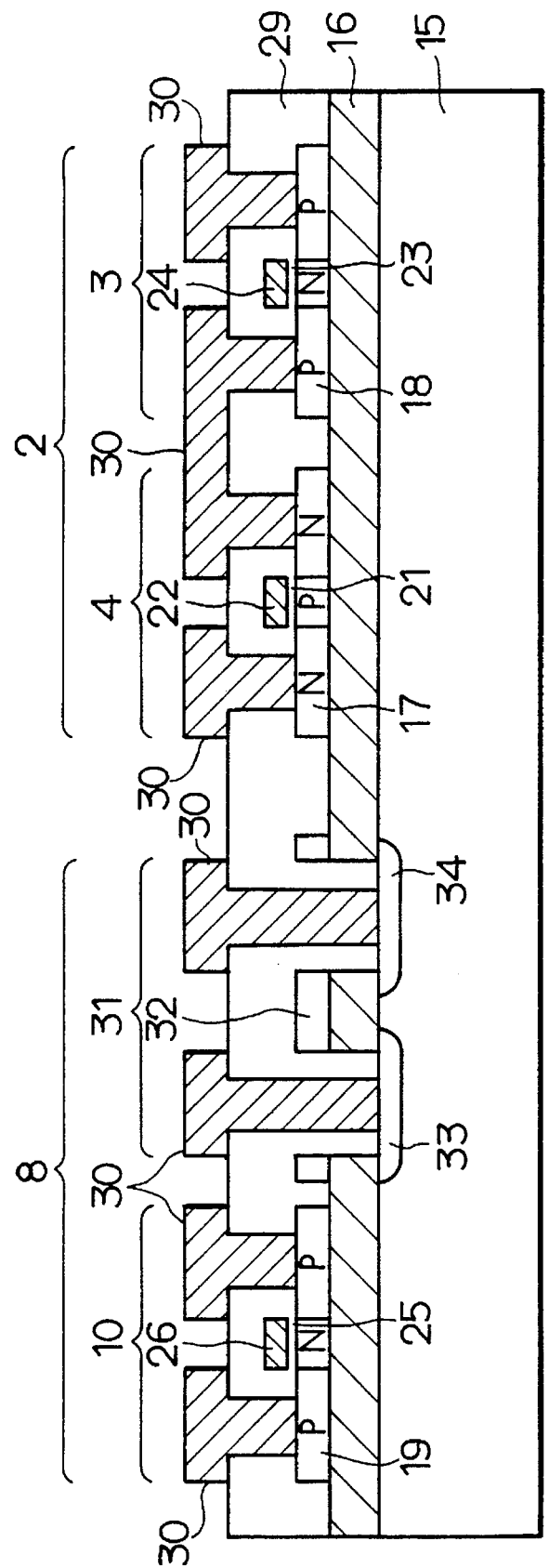
FIG. 5 is a cross-sectional view of another semiconductor integrated circuit device according to the first embodiment.

As a variation on the above design, an N-channel MOSFET 31 formed on single crystal silicon substrate 15 is used to provide a MOSFET having a high threshold voltage. In FIG. 5, SOI layer 32 is the gate electrode, embedded oxide film 16 is used as the gate oxide film and a MOSFET which is formed from source region 33 and drain region 34 inside single crystal silicon substrate 15 is used. This corresponds to the case when the gate oxide film thickness of the embodiment described above is made very thin. In this way, the threshold voltage of the MOSFET 31 can be adjusted by making the gate oxide film of the MOSFET 31 which forms protective circuit 8 thicker than gate oxide films 21, 23 of MOSFETs 3, 4 which form internal circuit 1. Meanwhile, a construction having a channel region different from the single crystal silicon substrate 15 member of the present invention can be used as the MOSFET.

Figure 6:
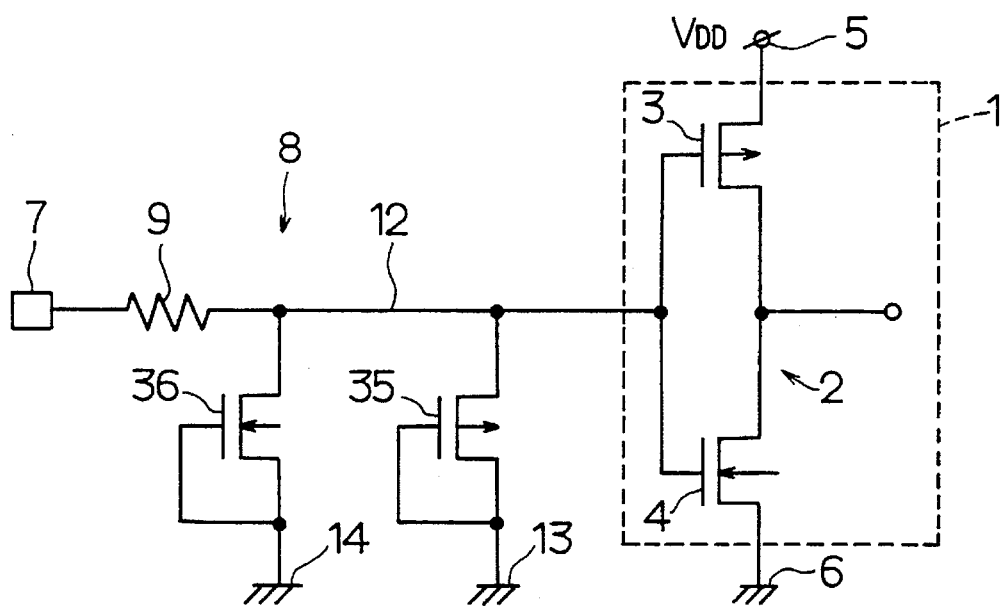
FIG. 6 is a schematic diagram of a semiconductor integrated circuit device according to a second embodiment of the present invention.

A second embodiment of the present invention is shown in FIG. 6. In this embodiment, P-channel MOSFET 35 and N-channel MOSFET 36 are used in place of P-channel and N-channel MOSFETs 10, 11, respectively. The gate terminals of MOSFETs 35, 36 are connected to ground terminals 13, 14, respectively. Here, if a positive surge voltage greater than the magnitude of the threshold voltage of P-channel MOSFET 35 is applied, P-channel MOSFET 35 switches on and excess voltage is released through ground terminal 13. Moreover, if a negative surge voltage greater than the magnitude of the threshold voltage of N-channel MOSFET 36 is applied, N-channel MOSFET 36 switches on and excess voltage is released through ground terminal 14. In the same way as the first embodiment, the magnitude of the threshold voltage of P-channel MOSFET 35 is higher than electric source voltage $V_{DD}$ but lower than the breakdown voltage of protective internal circuit 1.

Meanwhile, the present invention is not limited to the embodiments described above; for example, the transistor for the protective circuit which releases positive and negative excess voltages can be constructed using two N-channel MOSFETs or two P-channel MOSFETs.

Figure 7:
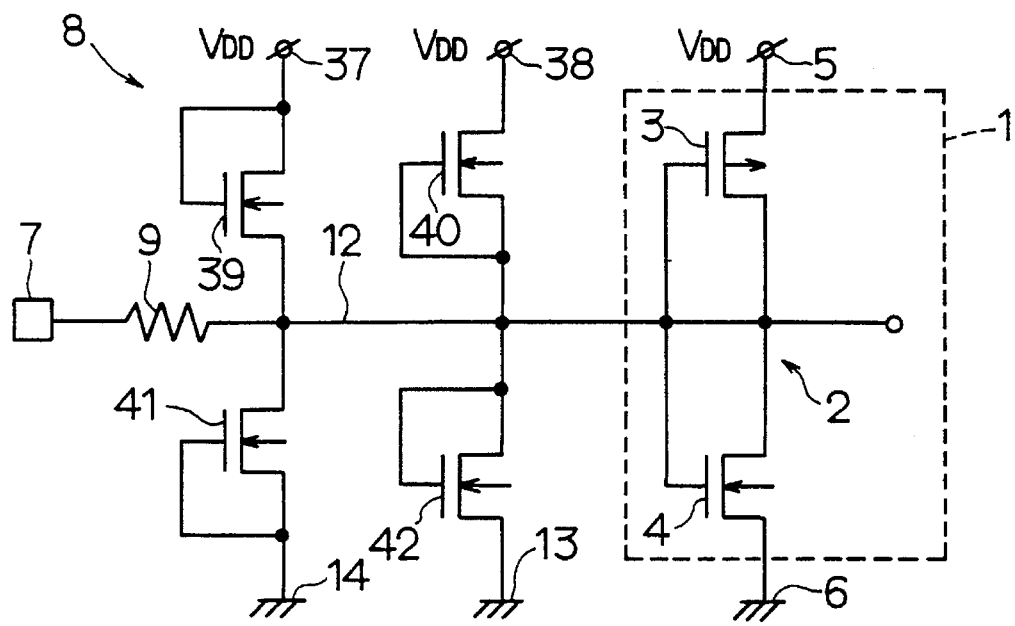
FIG. 7 is a schematic diagram of another semiconductor integrated circuit device according to the present invention.

Moreover, while a transistor for the protective circuit has been provided between input pad 7 which is the external connection terminal and ground terminals 13, 14 for the above embodiment, as shown in FIG. 7 transistors for a protective circuits 39, 40 can also be placed between input pad 7 which is the external connection terminal and electric source terminals 37, 38 while placing transistors for the protective circuit 41, 42 between input pad 7 and ground terminals 13, 14. The example shown in FIG. 7 shows the protective circuit 8 constructed using N-channel MOSFETs 39, 40, 41, 42. For this example, the magnitudes of the threshold voltages of N-channel MOSFETs 39, 42 are set higher than electric source voltage $V_{DD}$.

Furthermore, while a transistor for the protective circuit is provided between input pad 7 and ground terminals 13, 14 for the above embodiment, as shown in FIG. 7, transistors for the protective circuit 39, 40 can also be placed only between input pad 7 and electric source terminals 37, 38.

Moreover, transistors for the protective circuit can be provided between the pad and the other terminals aside from the electric source and ground terminals. Of course, protective circuit 8 can be constructed using the various combinations described above.

Figure 8:
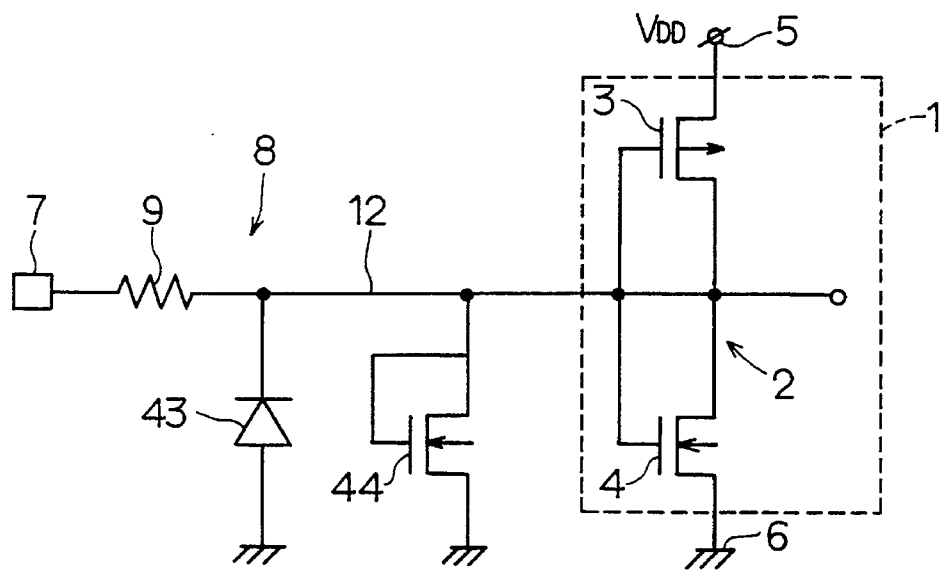
FIG. 8 is a schematic diagram of a semiconductor integrated circuit device according to a third embodiment of the present invention.

An equivalent circuit for a third embodiment of the present invention is shown in FIG. 8. This embodiment is different from the first and second embodiments in that when a negative surge voltage is applied to input pad 7, the excess voltage is released not through the ON-state current of the MOSFET but through the use of the forward bias of the diode. In other words, a diode 43 is used as the first element in place of P-channel MOSFET 10 of FIG. 1 and N-channel MOSFET 36 of FIG. 6. In the same way as in the first and second embodiments, if a positive surge voltage is applied to input pad 7, excess voltage is released using the ON-state current of N-channel MOSFET 44. In the same way as the first embodiment, the magnitude of the threshold voltage of N-channel MOSFET 44 is smaller than the reverse breakdown voltage of diode 43 but bigger than electric source voltage $V_{DD}$. Accordingly, positive excess voltage from the outside which exceeds the threshold voltage of N-channel MOSFET 44 is released through the ON-state current of N-channel MOSFET 44 before diode 43 breaks down.

Since excess voltage of either negative or positive polarity can be released without using current due to the breakdown of the MOSFET for this embodiment, the same effectiveness is maintained for either polarity of excess voltage.

Figure 9:
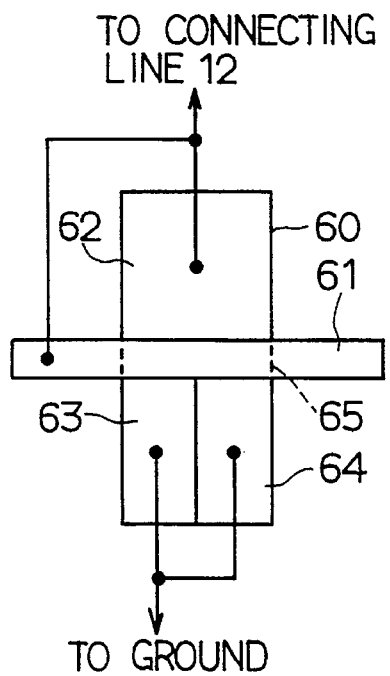
FIG. 9 is a plan view of a semiconductor integrated circuit device according to the third embodiment of the present invention.

While elements formed independently in the SOI layers 17–20 and the single crystal substrate 15 can be used as the diode 43 and the N-channel MOSFET 44, the construction shown in FIG. 9 can also be used for such. FIG. 9 shows an example of a flat layout when diode 43 and N-channel MOSFET 44 are constructed inside one SOI island 60. A diode of N+/P–/P+ structure having N+ diffusion layer 62, P–diffusion layer 65 and P+ diffusion layer 64 is connected in parallel with an N-channel MOSFET of N+/P–/N+ structure having N+ diffusion layer 62, P–diffusion layer 65 which is the channel formation region below gate electrode 61 and N+ diffusion layer 63. In addition, N+ diffusion layer 62 and gate electrode 61 are connected to connecting line 12 which connects input pad 7 and the input terminal of internal circuit 1 while N+ diffusion layer 63 and P+ diffusion layer 64 are connected to the ground terminal.

If excess negative voltage from connecting line 12 is applied to this element, the excess voltage is released to the ground terminal by the forward bias of the PN junction between P+ diffusion layer 64 and P–diffusion layer 65 which makes current flow from the N+ diffusion layer 62 to P+ diffusion layer 64. On the other hand, if excess positive voltage is applied from connecting line 12, an inversion layer, i.e., an N+ region, is formed in P–diffusion layer 65 below gate electrode 61, thus making current flow from N+diffusion layer 62 to N+ diffusion layer 63 via the inversion layer of P–diffusion layer 65. In other words, excess voltage is released to the ground terminal using the ON-state current of the N-channel MOSFET.

While a diode and N-channel MOSFET combination is used for the present embodiment, it goes without saying that the combination of diode and P-channel MOSFET can also be used and for this case, the conductive patterns are opposite to those in the above-described embodiment, the common P+ diffusion layer and gate electrode connect to the ground terminal, and the shorted N+ diffusion layer and P+ diffusion layer connect to connecting line 12.

According to the present construction, by making N+ diffusion layer 62 and P–diffusion layer 65 common to both diode and transistor among the numerous diffusion layers which constitute both diode and transistor, the occupation rate of the elements is lesser compared to when diode 43 and N-channel MOSFET 44 are formed separately.

Figure 10:
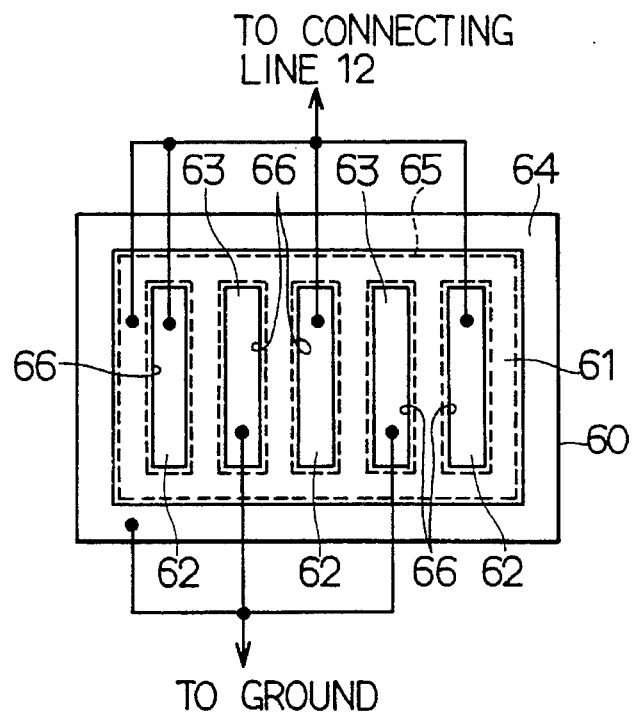
FIG. 10 is a plan view of an actual implementation of the semiconductor integrated circuit device according to the third embodiment of the present invention.
Figure 11:
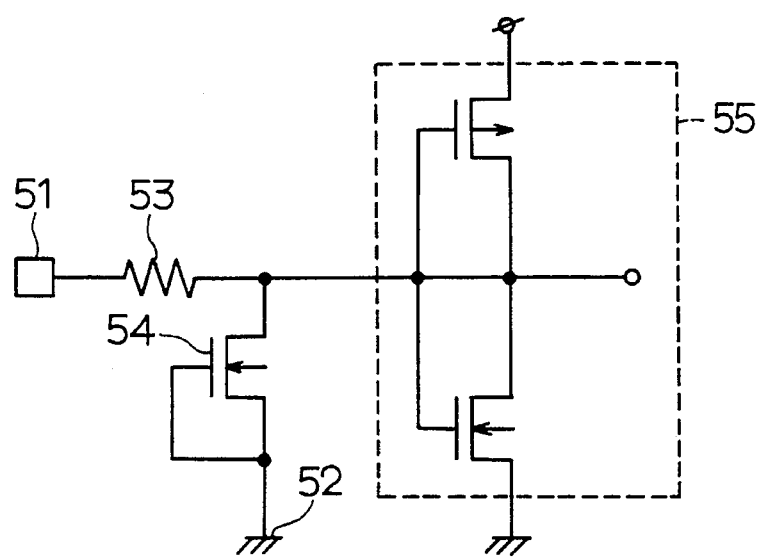
FIG. 11 is a schematic diagram of a conventional semiconductor integrated circuit device.

Another example of the present device is shown in FIG. 10. For this embodiment, gate electrodes 61 patterned in lattice form and having multiple openings 66 are formed on one SOI island 60, with N+ diffusion layers 62, 63 formed alternately on multiple SOI regions (the SOI region of the openings 66 of the lattice-arranged gate electrodes 61) whose perimeters are surrounded by gate electrodes together with forming P+ diffusion layers 64 in the SOI region surrounding the outer perimeter of gate electrodes 61. Moreover, N+diffusion layer 62 and gate electrode 61 are connected to wiring line 12 which connects input pad 7 and internal circuit 1 while N+ diffusion layer 63 and P+ diffusion layer 64 are connected to the ground terminals. For the present embodiment, in the same way as for the embodiment shown in FIG. 9, FIG. 10 shows that a diode of N+/P–/P+ structure having N+ diffusion layer 62, P–diffusion layer 65 and P+ diffusion layer 64 is connected in parallel with an N-channel MOSFET of N+/P–/N+ structure having N+ diffusion layer 62, P– diffusion layer 65 which is the channel formation region below gate electrode 61 and N+ diffusion layer 63.

According to the present construction, effectiveness of the device improves by lowering the density of excess current by widening the paths, i.e., the formation of enlarged channel widths for the diode and the MOSFET, through which current flows when excess voltage is released. In addition, by avoiding the formation of electric paths in the end parts of the SOI island, undesirable effects due to crystal defects or the like in the SOI end parts can be eliminated.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A semiconductor integrated circuit device comprising:
   a semiconductor substrate;
   an insulating layer disposed on said semiconductor substrate;
   a semiconductor layer disposed on said insulating layer;
   a semiconductor integrated circuit formed on said semiconductor layer, said integrated circuit having a first connection and a second connection;
   an external connection terminal connected to said first connection and which provides an external connection; and
   a protective circuit which protects said semiconductor integrated circuit from excess positive and negative voltages from said external connection terminal, said protective circuit including
   a first conductivity type first impurity diffusion layer in said semiconductor layer, said first impurity diffusion layer being electrically connected to said second connection,
   a first conductivity type second impurity diffusion layer, said second impurity diffusion layer being disposed in said semiconductor layer, said second impurity diffusion layer being connected electrically to said first connection,
   a gate electrode formed on said channel region via a gate insulating layer, said gate electrode being electrically connected to said first connection, and
   a second conductivity type third impurity diffusion layer disposed in said semiconductor layer, said third impurity diffusion layer being connected electrically to said second connection;
   wherein said second conductivity type third impurity diffusion layer forms a PN junction with said first conductivity type second impurity diffusion layer via said second conductivity type channel region.

2. The device of claim 1 wherein:
   said second and third impurity diffusion layers collectively form a diode passing excess negative voltage to said second connection; and
   said first and second impurity diffusion layers and said channel region collectively form a transistor passing excess positive voltage to said second connection.

3. The device of claim 2 wherein said third impurity diffusion layer is connected to said second impurity diffusion layer via said channel region so that it forms a PN junction with said second impurity diffusion layer.

4. A semiconductor integrated circuit device as claimed in claim 1 wherein:
   said third impurity diffusion layer is disposed around said first and second impurity diffusion layers through a low impurity concentration layer having substantially a same impurity concentration as said channel region; and said gate electrode is separated from said channel region and said low impurity concentration layer by a gate insulating film.

5. A semiconductor integrated circuit device comprising:

a semiconductor substrate;

an insulating layer disposed on said semiconductor substrate;

a semiconductor layer disposed on said insulating layer;

a semiconductor integrated circuit formed on said semiconductor layer, said integrated circuit having a first connection and a second connection;

an external connection terminal connected to said first connection and which provides an external connection;

a first semiconductor element in said semiconductor layer connecting said first and second connections, said first semiconductor element passing excess negative voltage from said external connection terminal to said second connection; and a second semiconductor element, in said semiconductor layer and separate from said first semiconductor element, said semiconductor element connecting said first and second connections, said second semiconductor element releasing excess positive voltage from said external connection terminal to said second connection;

a first MOS transistor releasing excess negative voltage using ON-state current flowing therethrough when said first semiconductor element is switched on by said excess negative voltage; and a second MOS transistor releasing excess positive voltage using ON-state current flowing when said second semiconductor element is switched on by said excess positive voltage;

wherein a magnitude of a threshold voltage of said first MOS transistor is smaller than a magnitude of a breakdown voltage of said second MOS transistor, and a magnitude of a threshold voltage of said second MOS transistor is smaller than a magnitude of a breakdown voltage of said first MOS transistor.

6. The device of claim 5, further comprising a third MOS transistor formed on said semiconductor layer, said third MOS transistor having a gate electrode connected to said first connection, said gate electrode being separated from said semiconductor layer by a gate insulating film having a predetermined thickness;

wherein said second MOS transistor has a gate oxide film that is thicker than said gate insulating film of said third MOS transistor.

7. A semiconductor integrated circuit device comprising:

a semiconductor substrate;

an insulating layer disposed on said semiconductor substrate;

a semiconductor layer disposed on said insulating layer;

a semiconductor integrated circuit formed on said semiconductor layer, said integrated circuit having a first connection and a second connection;

an external connection terminal connected to said first connection and which provides an external connection;

a first semiconductor element in said semiconductor layer connecting said first and second connections, said first semiconductor element passing excess negative voltage from said external connection terminal to said second connection; and a second semiconductor element, in said semiconductor layer and separate from said first semiconductor element, said semiconductor element connecting said first and second connections, said second semiconductor element releasing excess positive voltage from said external connection terminal to said second connection;

wherein said first semiconductor element includes a diode releasing excess negative voltage through forward bias current, said second semiconductor element includes a MOS transistor releasing excess positive voltage using ON-state current flowing when said MOS transistor is switched on responsive to said excess positive voltage, said diode includes multiple first impurity diffusion layers formed in said semiconductor layer, said MOS transistor includes multiple second impurity diffusion layers formed in said semiconductor layer and at least one of said multiple first impurity diffusion layers is also one of said multiple second impurity diffusion layers.

8. A semiconductor integrated circuit device as claimed in claim 7 wherein said diode and said MOS transistor are formed in a same semiconductor layer.

9. A semiconductor integrated circuit device as claimed in claim 7 wherein:

a plan view of said diode and said MOSFET includes gate electrodes arranged in lattice form on said semiconductor layer, said gate electrodes having multiple openings;

a portion of said semiconductor layer corresponding to said multiple openings includes a common first conductivity type diffusion layer and a first conductivity type MOSFET diffusion layer; and said semiconductor layer at a peripheral portion of said gate electrodes includes a high impurity concentration second conductivity type diffusion layer.

10. A semiconductor integrated circuit device as claimed in claim 9 wherein:

said common first conductivity type diffusion layer includes an N-type diffusion layer;

said common first conductivity type diffusion layer and at least one of said gate electrodes are connected to said external connection terminal;

said first conductivity type MOSFET diffusion layer includes an N-type diffusion layer;

said high impurity concentration second conductivity diffusion layer includes a P-type diode diffusion layer; and said first conductivity type diffusion layer and said second conductivity diffusion layer are connected to a common terminal.

11. A semiconductor integrated circuit device as claimed in claim 9 wherein:

said common first conductivity type diffusion layer includes a P-type diffusion layer;

said common first type conductivity diffusion layer and at least one of said electrodes are connected to a common terminal;

said first conductivity type MOSFET diffusion layer includes a P-type diffusion layer;

said high impurity concentration second conductivity type diffusion layer includes an N-type diode diffusion layer; and said first conductivity type MOSFET diffusion layer and said high impurity concentration second conductivity type diffusion layer are connected to said external connection terminal.

* * * * *